US010200061B2

(12) United States Patent
Feygin et al.

(10) Patent No.: US 10,200,061 B2
(45) Date of Patent: *Feb. 5, 2019

(54) SYSTEM AND METHOD FOR MAXIMAL CODE POLARIZATION

(71) Applicant: Samsung Electronics Co., Ltd., Gyeonggi-do (KR)

(72) Inventors: Gennady Feygin, San Diego, CA (US); Mostafa El-Khamy, San Diego, CA (US); Hessam Mahdavifar, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/118,655

(22) Filed: Aug. 31, 2018

(65) Prior Publication Data
US 2018/0375526 A1    Dec. 27, 2018

Related U.S. Application Data

(63) Continuation of application No. 15/459,962, filed on Mar. 15, 2017, now Pat. No. 10,069,510.
(Continued)

(51) Int. Cl.
*H03M 7/30* (2006.01)
*H03M 13/13* (2006.01)
(Continued)

(52) U.S. Cl.
CPC .......... *H03M 7/30* (2013.01); *G06F 17/5081* (2013.01); *H01L 22/20* (2013.01); *H03M 13/00* (2013.01);
(Continued)

(58) Field of Classification Search
CPC .............. H03M 7/30; H03M 13/3746; H03M 13/1575; H03M 13/611; H01L 22/20; G06F 17/5081
(Continued)

(56) References Cited

U.S. PATENT DOCUMENTS 7,656,337 B2    2/2010   Redmayne et al.
8,385,439 B2    2/2013   Djordjevic et al.
(Continued)

FOREIGN PATENT DOCUMENTS

WO    WO 2016/101089    6/2016

OTHER PUBLICATIONS

Hessam Mahdavifar, "Fast Polarization and Finite-Length Scaling for Non-Stationary Channels", Department of Electrical and Computer Engineering, University of Michigan Ann Arbor, USA, Email: hessam@umich.edu, Nov. 13, 2016.
(Continued)

*Primary Examiner* — Peguy Jean Pierre
(74) *Attorney, Agent, or Firm* — The Farrell Law Firm, P.C.

(57) ABSTRACT

An apparatus and a method. The apparatus includes a plurality of polarization processors, including n inputs and n outputs, where n is an integer, wherein the plurality of polarization processors is configured to polarize channels with different bit-channel reliability; and at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at
(Continued)

least one permutation processor is configured to not further polarize a bit channel.

20 Claims, 4 Drawing Sheets

Related U.S. Application Data

(60) Provisional application No. 62/432,155, filed on Dec. 9, 2016, provisional application No. 62/424,960, filed on Nov. 21, 2016.

(51) Int. Cl.
*H01L 21/66* (2006.01)
*H03M 13/00* (2006.01)
*H03M 13/01* (2006.01)
*G06F 17/50* (2006.01)

(52) U.S. Cl.
CPC .......... *H03M 13/01* (2013.01); *H03M 13/13* (2013.01); *H03M 13/611* (2013.01)

(58) Field of Classification Search
USPC .......................................................... 341/50
See application file for complete search history.

(56) References Cited

U.S. PATENT DOCUMENTS

| | | | |
|---|---|---|---|
| 9,083,387 B2 | 7/2015 | Mahdavifar et al. | |
| 9,164,835 B2 | 10/2015 | Lee et al. | |
| 9,176,927 B2 | 11/2015 | Gross et al. | |
| 9,239,295 B2 * | 1/2016 | Peng | G01N 21/21 |
| 9,454,552 B2 | 9/2016 | Ma | |
| 9,479,291 B2 | 10/2016 | Mahdavifar et al. | |
| 9,504,042 B2 | 11/2016 | El-Khamy et al. | |
| 2015/0295593 A1 | 10/2015 | Trifonov | |
| 2015/0333775 A1 | 11/2015 | Korb et al. | |
| 2016/0164629 A1 | 6/2016 | Ahn et al. | |
| 2016/0182187 A1 | 6/2016 | Kim et al. | |
| 2016/0204811 A1 | 7/2016 | Goela et al. | |
| 2016/0248547 A1 | 8/2016 | Shen et al. | |
| 2016/0285479 A1 | 9/2016 | El-Khamy et al. | |
| 2016/0294418 A1 | 10/2016 | Huang et al. | |
| 2017/0097281 A1 * | 4/2017 | Wang | G01M 11/3181 |
| 2018/0026747 A1 * | 1/2018 | Rong | H03M 13/13 |
| | | | 714/776 |

OTHER PUBLICATIONS

Peter Trifonov, et al. "Twisted Polar Codes", Saint-Petersburg State Polytechnic University, Email: {peter,veram}@dcn.icc.spbstu.ru, Oct. 26-29, 2014, pp. 443-447.

Min Ye, et al. "Polar Codes Using Dynamic Kernels", 978-1-4673-7704-1/15, IEEE, ISIT 2015, pp. 231-235.

Eren Sasoglu, et al. "Universal Polarization", Dec. 27, 2013, pp. 1-11.

Dongsheng Wu, et al. "Concentrated Polar Codes Based on Selective Polarization", College of Communications Engineering, PLA University of Science and Technology, Nanjing 210007, China, Email: dongshengwu@yeah.net, 2015 IEEE, pp. 436-442.

Eran Hof, et al. "Polar Coding for Reliable Communications over Parallel Channels", Submitted to the 2010 IEEE Information Theory Workshop, May 16, 2010.

Erdal Arikan, Senior Member, IEEE, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

Ido Tal, et al. Member, IEEE, "List Decoding of Polar Codes", IEEE Transactions on Information Theory, vol. 61, No. 5, May 2015, pp. 2213-2226.

M. El-Khamy, et al. "Binary polar codes are optimised codes for bitwise multistage decoding", Electronics Letters, Jun. 23, 2016, vol. 52, No. 13. pp. 1130-1132.

Norbert Stolte, et al. "Recursive Codes with the Plotkin-Construction and Their Decoding", Thesis—May 2003, pp. 1-138.

* cited by examiner

SYSTEM AND METHOD FOR MAXIMAL CODE POLARIZATION

PRIORITY

This continuation application claims priority under 35 U.S.C. § 120 to a U.S. patent application filed on Mar. 15, 2017 in the United States Patent and Trademark Office (USPTO) and assigned Ser. No. 15/459,962, which claims priority under 35 U.S.C. § 119(e) to a U.S. Provisional Patent Application filed on Nov. 21, 2016 in the USPTO and assigned Ser. No. 62/424,960, and a U.S. Provisional Patent Application filed on Dec. 9, 2016 in the USPTO and assigned Ser. No. 62/432,155, the entire contents of each of which are incorporated herein by reference.

FIELD

The present disclosure relates generally to wireless communication systems, and more particularly, to system and method for maximal code polarization.

BACKGROUND

Polar codes are capacity achieving codes that have received much attention lately, and are being considered for specification as the channel codes in fifth generation (5G) communication systems. Currently, polar codes have been adopted for the control channel of 5G systems. They are also being considered as error correcting codes in memory systems.

Polar codes can be encoded and decoded with relatively low complexity, where the encoding complexity of polar codes is N log N for a code of length N. Polar codes are traditionally decoded by a successive cancellation decoder, which can be implemented in a butterfly structure with complexity O(N log N).

Polar codes are based on the concept of channel polarization, which is a technique of applying transformation operations to convert an ensemble of mediocre bit-channels into two disjoint subsets: good channels that have much better reliability (noise-free), and the remaining channels, called bad channels that are transformed into erroneous channels (very noisy). The definition of a bit-channel assumes that a successive cancellation decoder is deployed at the output, where the ith bit-channel, assumes all the preceding i−1 bits are already decoded and are available at channel output, together with all N channel observations for a code of length N, when decoding the ith bit.

A polarization stage includes a channel combining operation and a channel splitting operation. For a 2×2 polarization matrix $$P = \begin{bmatrix} 1 & 0 \\ 1 & 1 \end{bmatrix},$$

this maps 2 bit channels $(W,W) \to (W^-, W^+)$, where $W^-$ is referred to as a degraded channel and $W^+$ is referred to as an upgraded channel. With a successive cancellation decoder, and channel output alphabet Y, the following channel transformations $W:\{0,1\} \to Y$, $W^-:\{0,1\} \to Y^2$, and $W^+:\{0,1\} \to \{0,1\} \times Y^2$ are generated, as the following inequality in Equation (1) below for the channel information rates holds:

$$I(W^-) \leq I(W) \leq I(W^+), \tag{1}$$

such that the sum capacity is preserved $I(W^-)+I(W^+)=2I(W)$.

Channel transition probabilities of polarized channels are given by Equations (2) and (3) as follows:

$$W^-(y_1,y_2|x_1) = \tfrac{1}{2}\sum_{x_2 \in \{0,1\}} W(y_1|x_1 \oplus x_2)W(y_2|x_2) \tag{2}$$

and:

$$W^+(y_1,y_2,x_1|x_2) = \tfrac{1}{2}W(y_1|x_1 \oplus x_2)W(y_2|x_2) \tag{3}$$

such that the successive cancellation decoder decodes $x_1$ with the knowledge of channel observations $\{y_1, y_2\}$, and then decodes $x_2$ with the knowledge of the channel observations as well as the decoded $x_1$. The unreliability of the channel may be measured by a Bhattacharya parameter (BP), Z(W), such that channels with BP close to zero are noiseless channels and channels with BP close to 1 are very noisy.

To construct a polar code of length l, an l×l channel transformation is formed by determining an n-fold Kronecker power of P, where $n = \log_2 l$, and an nth Kronecker power is given by $$P_l = P^{\otimes n} = \begin{bmatrix} P^{\otimes(n-1)} & 0 \\ P^{\otimes(n-1)} & P^{\otimes(n-1)} \end{bmatrix}.$$

This may also be followed by a bit-reversal permutation. If $u_1^l = \{u_1, u_2, \ldots, u_l\}$ denotes a vector of l independent and uniform binary random variables, then their polar transformation is given by $x_1^l = u_1^l P_l$ and $x_1^l$ may be transmitted through l independent copies of a discrete memoryless channel W. In such a case, the BPs of the ith bit channel for a code of length 2l may be calculated recursively from those of a code of length l through the recursive formulas, by denoting the ith bit channel for a code of length l by $W_l^i$ in Equations (4) and (5) as follows:

$$Z(W_{2l}^{2i-1}) \leq 2Z(W_l^i) - Z(W_l^i)^2 \tag{4}$$

$$Z(W_{2l}^{2i}) = Z(W_l^i)^2 \tag{5}$$

where the equality in Equations (4) and (5) holds in the case of a binary erasure channel.

The channel polarization theorem states that, as the code length N goes to infinity, the bit-channels start polarizing, indicating that they either become good channels, or bad channels. The crux of polar codes is to carry the information bits on the upgraded channels and freeze the degraded channels by setting all bits on degraded channels to a predetermined value, e.g., all zeros. Polar codes are capacity achieving on binary memory-less symmetric channels as the ratio of good channels to the code length N approaches the channel capacity, and as the code length N goes to infinity.

SUMMARY

According to one embodiment, an apparatus includes a plurality of polarization processors, including n inputs and n outputs, where n is an integer, wherein the plurality of polarization processors is configured to polarize channels with different bit-channel reliability; and at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at least one permutation processor is configured to not further polarize a bit channel.

According to one embodiment, a method includes polarizing, by a plurality of polarization processors including n inputs and n outputs, where n is an integer, channels with different bit-channel reliability; and permuting, by at least one permutation processor, n outputs of each of the plurality of polarization processors to not further polarize a bit channel, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern.

According to one embodiment, a method of manufacturing an apparatus includes forming the apparatus on a wafer or a package with at least one other apparatus, wherein the apparatus comprises a plurality of polarization processors, including n inputs and n outputs, where n is an integer, wherein the plurality of polarization processors is configured to polarize channels with different bit-channel reliability, and at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at least one permutation processor is configured to not further polarize a bit channel; and testing the apparatus, wherein testing the coarse timing and frequency synchronization apparatus comprises testing the apparatus using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include an apparatus comprising a plurality of polarization processors, including n inputs and n outputs, where n is an integer, wherein the plurality of polarization processors is configured to polarize channels with different bit-channel reliability, and at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at least one permutation processor is configured to not further polarize a bit channel; disregarding relative positions of the macros for compliance to layout design rules during the generation of the mask layout; checking the relative positions of the macros for compliance to layout design rules after generating the mask layout; upon detection of non-compliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
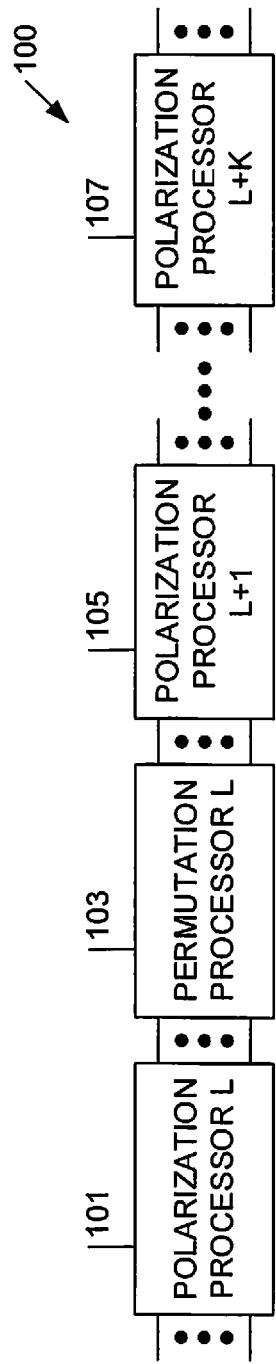
FIG. 1 illustrates an exemplary block diagram of an apparatus for maximal code polarization, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

A polar code is an error correcting coding technique. It has been proven that polar codes are Shannon capacity-achieving block codes. A recursive encoding/decoding scheme to implement a polar code includes transmitting N bits over N parallel channels. Two channels with some probability of error may be jointly re-mapped in such a manner that one of the channels will experience improved probability of error, while the other channel will experience higher probability of error. This is referred to as polarization. At the completion of the recursive process for log N levels, N polarized channels will split into two groups: m channels with very low probability of error (e.g., ~0) and N-m channels with very high probability of error (e.g., ~0.5). The encoder transmits m bits on m good channels, and a fixed sequence (e.g., all zeros) on N-m poor channels. The decoder uses its knowledge of transmitted sequence on poor channels to set decoded bits on the corresponding channels accordingly, then proceeds to recover m good channels using received information plus a known sequence.

Conventional technologies select channels to polarize together based on a butterfly interleaver. A large number of channel polarization operations is required to achieve full polarization, particularly for large block length N. Polarizing channels with similar probabilities of error does not maximize overall separation of channels into good and poor channels.

Compound polar codes have been developed for transmission on channels with different reliabilities, as bit-interleaved coded modulation (BICM) channels, quasi-static fading channels, and non-stationary channels. Two stage encoding has been used to construct punctured polar codes for hybrid automatic repeat request (HARQ) transmissions, where punctured bit-channels are considered different from non-punctured bit-channels. In this case, sub-blocks of bit channels are polarized together in a two stage polarization approach, where the different channels are first polarized together at the first stage to result in a set of different channels, and at the second polarization stage similar channels are polarized together through a certain sub-block channel permutation between both stages.

Relaxed polar codes allow for the skipping of polarization operations at each polarization level without degrading the channel error probability. In one embodiment, bit-channels that are either too good or too bad are not further polarized (e.g., are skipped). Relaxed polar codes allow for the skipping of polarization operations, thereby reducing both the encoding and decoding complexities at a transmitter and at a receiver.

The present disclosure concerns a system and method for improving the polarization of polar codes which is referred to as maximal polarization. The present disclosure also concerns a system and method for combining maximal polarization with polar code constructions, relaxed polarization, and compound polarization.

The crux of maximal polarization is to achieve a better polarization of bit-channels without increasing a code's block length. Since maximal polarization results in better polarization at a certain block length as compared to conventional polarization, maximal polarization is a method for faster polarization for a given polarization target. Since better polarization indicates lower bit-channel error probabilities for the good channels, it is also a method to increase the code rate for a given target error probability and code length.

A conventional (or default) permutation between polarization stages assumes a Fast Fourier Transform (FFT-like) butterfly structure, where copies (or multiplicities) of a channel are polarized into a better channel and a worse channel. In the present disclosure, an enabler of maximal polarization is a permutation processor or interleaver, or alternatively a bit-channel permutation, implemented at each polarization stage $n<\log_2 N$, where a permutation is chosen to connect the outputs of polarization stage n to the inputs of polarization stage n+1 to maximally polarize the bit channels at stage n+1. A certain permutation is chosen to maximize polarization at the output of stage n+1. Design criteria depend on code design parameters, such as a target code rate, and a target error probability.

FIG. 1 illustrates an exemplary block diagram of an apparatus for maximal code polarization, according to one embodiment.

Referring to FIG. 1, the apparatus 100 includes a plurality of polarization processors 101, 105, 107, and a plurality of permutation processors 103.

The first of the plurality of polarization processors 101 (e.g., polarization processor L, where L is an integer) includes n inputs and n outputs, where n is an integer.

The first of the plurality of permutation processors 103 (e.g., permutation processor L) includes n inputs connected to the n outputs of the first of the plurality of polarization processors 101, and n outputs.

The second of the plurality of polarization processors 105 (e.g., polarization processor L+1) includes n inputs connected to the n outputs of the first of the plurality of permutation processors 103 and n outputs. This pattern continues until the last of the plurality of polarization processors 107 (e.g., polarization processor L+K, where K is an integer). A permutation processor is not required after the last polarization processor, because including such a permutation processor would not improve performance. However, in one embodiment, such a permutation processor may be included for convenience since transmitted code would be at the output of the last polarization processor. Interleaving of bits may be required to be of a "standard" order or, otherwise, an order agreed upon by both a transmitter and a receiver.

Figure 2:
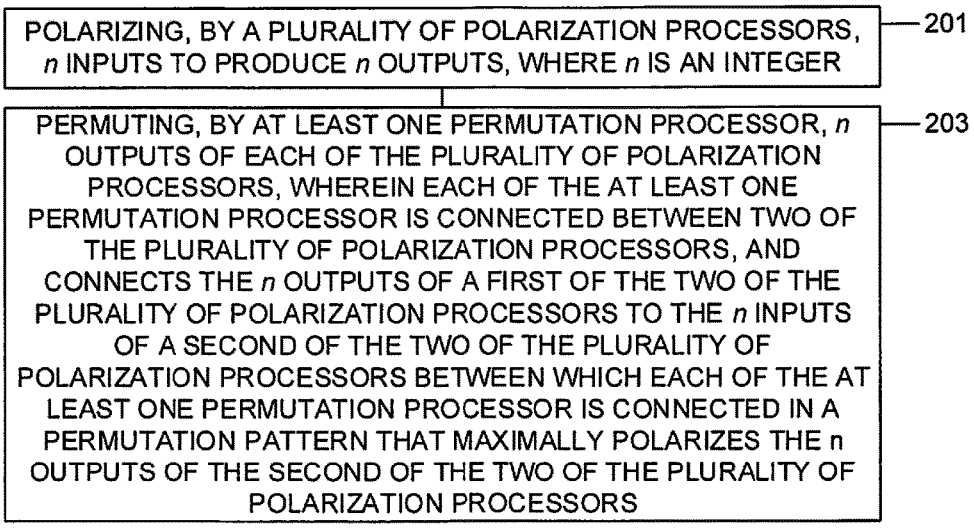
FIG. 2 illustrates an exemplary flowchart of a method of maximal code polarization, according to one embodiment.

FIG. 2 illustrates an exemplary flowchart of a method of maximal code polarization, according to one embodiment.

Referring to FIG. 2, n inputs are polarized, by a plurality of polarization processors, to produce n outputs, where n is an integer, at 201.

At 203, the n outputs of each of the plurality of polarization processors are permuted, by a plurality of permutation processors. Each of the plurality of permutation processors is connected between two of the plurality of polarization processors. Each of the plurality of permutation processors connects the n outputs of a first of the two of the plurality of polarizations processors to the n inputs of a second of the two of the plurality of polarization processors between which each of the plurality of permutation processors is connected in a permutation pattern. The permutation pattern is determined to maximally polarize the n outputs of the second of the two of the plurality of polarization processors.

According to one embodiment, maximal polarization may be applied in addition to, or on top of, compound polarization implied by a two stage encoding as described above with respect to compound polar codes and two-stage encoding as well as by applying an inter-stage permutation at each polarization level to each of the sub-blocks of bit-channels. According to one embodiment, maximal polarization includes performing bit-channel permutation at each polarization level, rather than only at one polarization level in the middle of the encoding process. According to one embodiment, different sub-blocks may potentially have different bit-channel permutations. However, concatenating all permutations on different sub-blocks may define a single permutation over all the N bit-channels as in maximal polarization described above. The present system may combine different channels at the same polarization block.

According to one embodiment, maximal polarization is performed together with relaxed polarization. In relaxed polarization, a bit-channel is not further polarized if it is very good and its polarization level exceeds a good threshold, or if it is very bad and degrades below a bad threshold. With maximal polarization, polarization steps including channel combining and splitting operations may be skipped if the steps do not improve an aggregate channel polarization criterion defined by maximal polarization. An example of such a criterion is an aggregate bit-channel error probability for a target rate which defines good and bad thresholds for relaxed polarization.

According to one embodiment, the present system and method provides maximally polarizing polar codes by permuting bit-channels between polarization stages or levels, and their encodings. According to one embodiment, the present system and method provides maximally polarizing polar codes with two stage encoding, however two stages are selected only for purpose of illustration and many more stages (larger N) are typically employed. According to one embodiment, the present system and method provides maximally polarizing polar codes while skipping operations. According to one embodiment, the present system and method applies maximal polarization over channels with different reliabilities. According to one embodiment, the present system and method decodes maximally polarizing codes.

According to one embodiment, binary polar codes with the 2×2 Hadamard Kernel are used. However, the present disclosure is not limited thereto, and, for example, non-binary polar codes and codes with larger kernel sizes may be used. The 2×2 Hadamard kernel is given by $$P = \begin{bmatrix} 1 & 0 \\ 1 & 1 \end{bmatrix}.$$

As described above, the reliability of a polarized bit-channel may be determined by their Bhattacharyya parameters when polarizing a multiplicity of a bit channel, so that both input channels are identical and have Bhattacharya parameter $Z(W_I^i)$ as expressed in Equations (6) and (7) as follows:

$$Z(W_{2I}^{2i-1}) \leq 2Z(W_I^i) - Z(W_I^i)^2 \tag{6}$$

$$Z(W_{2I}^{2i}) = Z(W_I^i)^2 \tag{7}$$

For erasure channels with channel erasure probability $\epsilon$, the Bhattacharya parameter is simply $Z(W)=\epsilon$, and the inequality in the Equation (6) above holds with equality. Moreover, the information rate or capacity is given by $I(W)=1-Z(W)$.

In one embodiment, a permutation is applied at each polarization stage, where the input channels have different reliability. Thus, for two bit channels with different channel reliabilities W and X, the reliability of the polarized bit-channels may be described by Bhattacharya parameters, where $(W_{2I}^{2i-1})$ is the output degraded channel, and $(W_{2I}^{2i})$ is the output upgraded channel as expressed in Equations (8) and (9) as follows:

$$Z(W_{2I}^{2i-1}) \leq Z(W_I^i) + Z(X_I^i) - Z(X_I^i)Z(W_I^i) \tag{8}$$

$$Z(W_{2I}^{2i}) = Z(W_I^i)Z(X_I^i) \tag{9}$$

In one embodiment, channel capacities of polarized bit-channels may be expressed in terms of those of the input non-identical bit-channels, with $I(W)=1$ indicating a noiseless channel. For example, considering erasure channels, channel information rates may be expressed as in Equations (10) and (11) as follows:

$$I(W_{2I}^{2i}) = I(W_I^i) + I(X_I^i) - I(X_I^i)I(W_I^i) \tag{10}$$

$$I(W_{2I}^{2i-1}) = I(W_I^i)I(X_I^i) \tag{11}$$

Since $0 \leq I(W) \leq 1$, assuming without loss of generality, that $I(X_I^i) \leq I(W_I^i)$, channel information rate may be expressed as in Equation (12) as follows:

$$I(W_{2I}^{2i-1}) \leq I(X_I^i) \leq I(W_I^i) \leq I(W_{2I}^{2i}) \tag{12}$$

In other words, by polarizing a good channel with a bad channel, the upgraded channel becomes better than the good channel and the degraded output channel becomes worse than the bad channel. This indicates that conventional, or default, inputs to the polarization blocks at stage n using conventional, or default, butterfly connections may not give the best desired polarization and that it is often better to find a different permutation to guarantee better polarization according to the desired code design criterion. Polar codes are designed for either a certain target rate R or a certain target error probability $P_e$.

According to one embodiment, the design target may be a certain code rate $R \leq C$, where C is the channel capacity. As the polar code length N approaches infinity, the code rate of a polar code R may approach C with vanishing error probability. In this case, the number of information bit-channels $N_i$ is approximately $R \times N$, and the number of frozen bit-channels $N_f$ is roughly $(1-R) \times N$. In one embodiment, the code may be polarized to stage $n \leq \log_2 N$.

In one embodiment, bit-channels are sorted according to their reliability. The reliability measure may be measured in terms of information capacity, including a Bhattacharyya parameter, an expected bit-channel error probability, an expected likelihood ratio, an expected signal-to-noise ratio (SNR), and a bit-channel capacity I. The good channel set $G_{n-1}$ at stage n−1 includes information bits polarized until stage n−1 and is of size R×N. In this case, $G_n$ will include the Floor(R×N) bit-channels with the largest information bit-channel capacities I, largest expected likelihood ratios E(L), smallest Bhattacharrya parameters, or equivalently with the smallest expected bit-channel error probabilities, where Floor(x) is a floor function.

In one embodiment, all of the factorial of N (e.g., N!) permutations of the bit-channels input to the polarization level n are considered. In one embodiment, a permutation that maximizes the polarization of the good channel set at level n is selected. In other words, for each possible permutation π, a polarization at stage n is performed, and a new good channel set $G_n$ of size R×N at stage n is calculated. The permutation that provides the best good channel set is chosen. According to the metric used to define the good channel described above, the best good channel set is the one with the smallest sum of its bit-channel error probabilities, largest sum of its bit-channel SNRs or likelihood ratios E(L), largest sum of its bit-channel capacities I, or smallest Bhattacharrya parameters. This method has exponential complexity, however the computation must only be performed once when a code is being constructed, and does not incur any computational costs during the use of the code for encoding and decoding.

For any metric described above (e.g., information bit-channel capacities), one embodiment may set an adaptive threshold $T_{n-1}$ at level (n−1)=$\log_2$ 1 to be that of the worst channel in the information set $G_{n-1}$, e.g., $$T_{n-1} = \min_I I(W_I^i) - \delta$$

for $W_I^i \in G_{n-1}$, where δ is a small value, and where the threshold $T_{n-1}$ depends on the target R.

Polarization preserves the sum of the information bit-channel capacities at the input and output of a polarization block, e.g., $I(W_{2I}^{2i}) + I(W_{2I}^{2i-1}) = I(W_I^i) + I(X_I^i)$. Thus, there is no need to change the permutation at inputs of polarization blocks whose descendants will still be in the information set according to the threshold $T_{n-1}$. This is the case for the bit channels with information capacities of $I(W_I^i) \gg T_{n-1}$.

Permutations may be changed from a conventional, or default, permutation by swapping connections to next polarization blocks for bit-channels whose information bit-channel capacities are close to the threshold $T_{n-1}$, or boundary. If a bit-channel is polarized with its copy, or multiplicity, in the default permutation, then $I(W_{2I}^{2i-1}) = I(W_I^i)^2$, and the degraded output bit channel will fall below the adaptive threshold $T_{n-1}$ into a frozen channel set and become a bad channel if $I(W_I^i)_g \le \sqrt{T_n}$.

In one embodiment, a channel which is polarized with its multiplicity may be in a frozen channel set if the channel's associated $I(W_I^i) < T_{n-1}$. A conventional, or default, output upgraded channel $I(W_{2I}^{2i})$ may fall in the good channel set if $2I(W_I^i) - I(W_I^i)^2 \ge T_{n-1}$. This is equivalent to the condition $I(W_I^i) > I(W_I^i)_b$, where $I(W_I^i)_b = 1 - \sqrt{1 - T_n}$.

A permutation may be found by considering possible hybrid polarizations by swapping connections at inputs of polarization blocks for hybrid polarization between channels ($W_I^i$) in the good channel set $G_{n-1}$ with information bit channel capacities $T_{n-1} \le I(W_I^i) \le I(W_I^i)_g$ and channels in the frozen channel set $F_{n-1}$ with information bit channel capacities $T_{n-1} > I(W_I^i) > I(W_I^i)_b$. The number of such good and bad bit-channels close to the threshold, or boundary, $T_{n-1}$ will be much smaller than N, and only K! permutations must be considered, where K is the number of bit-channels considered around the threshold, or boundary, $T_{n-1}$ in either the good channel set or the frozen channel set.

In one embodiment, only K bit channels around either side of the adaptive threshold $T_n$ at level n are considered for hybrid polarization, where K may be determined by a target design, encoding complexities, and decoding complexities.

For example, if a code is of length N=1024 bits, all of the factorial of N (e.g., N!) permutations of the bit-channels input to the polarization level n are considered, and $$N! \sim \sqrt{2\pi N} \left(\frac{N}{e}\right)^N,$$

then the number of permutations is effectively infinite and cannot be evaluated, whereas for K=5, the number of permutations considered for choosing the maximal polarizing permutation is just 120.

By construction and choice of permutation, the maximal polarization is illustrated by the fact that the sum capacities of the upgraded channels of both hybrid polarizations after permutation is larger than the sum capacities of the upgraded channels with conventional, or default, polarization without permutation. Similarly the sum of the capacities of the output degraded channels after permutation is smaller than those before permutation, which is a desirable feature since by choosing channels to be permuted that are around the threshold $T_n$, or boundary, these degraded channels fall into the frozen set and have information capacities close to zero, which corresponds to maximal polarization.

For example, if $T_n$=0.25, then $I(W_I^i)_g$=0.5 and $I(W_I^i)_b$=0.13397. If a good channel $W_1$ has $I(W_1)$=0.3, then the output channels after $W_1$ is polarized with its copy, or multiplicity, as in conventional, or default, polarization is $I_g(W_{11})$=0.51 and $I_b(W_{11})$=0.09, for the upgraded channel and the degraded channel respectively. Also, consider a bad channel in the frozen set around the boundary with $I(W_2)$ =0.2, then the output upgraded and degraded channels respectively after default polarization with its multiplicity are $I_g(W_{22})$=0.36 and $I_b(W_{22})$=0.04. Note that both $I_g(W_{11})$ and $I_g(W_{22})$ are greater than $T_n$ and will fall in the good channel set. Also, $I_b(W_{11})$ and $I_b(W_{22})$ will fall in frozen set. Hence, after polarization, their contribution to the sum capacity of the good channel set is 0.51+0.36=0.87 bits. Now, consider the permutation where $W_1$ and $W_2$ are polarized with each other. The output upgraded bit-channel has capacity $I_g(W_{12})$=0.44 which falls in the good channel set, and the output degraded bit-channel after hybrid polarization has capacity $I_b(W_{12})$=0.06 which falls in the frozen channel set. Now, consider this is done for their multiplicities, as well then the contribution of the upgraded bit-channel to the sum capacity of the information set is 2×0.44=0.88 bits, which exceeds the 0.87 bits achievable by default polarization without permutation. Hence, this permutation results in a maximal polarization of the information set.

The above embodiment can be observed as ranking and partitioning the bit channels into 3 groups, good channel group with $1 \ge I(W_I^i) \ge I(W_I^i)_g$, mediocre channel group those with $I(W_I^i)_b \le I(W_I^i) < I(W_I^i)_g$, bad channel group $I(W_I^i)_b > I(W_I^i) \ge 0$. The permutation is chosen at each polarization level such that channels are grouped, according to their I(W). Then channels in the good channel group are polarized together, channels in the mediocre channel group are polarized together, channels in the bad channel group are polarized together. For lower complexity without affecting performance, the channels of the good channel group are polarized by the regular butterflies since their descendants remain in the information good channel set. Similarly, the polarization for the very bad channel group are defined as the regular butterflies. Only different possible permutations of the indices of those bit-channels in the mediocre channel group need to be are considered for the purpose of maximal polarization. Hence, the aggregate permutation of indices at each polarization level is defined.

As mentioned above, for the next stage the threshold $T_n$ can be calculated according to desired code rate or target error probability. The channels are regrouped into the 3 classes as defined by the threshold, and the maximal permutation for stage n is found as described above, this permutation will, in general be different from that at stage n−1. In one embodiment, the permutation map of length N for each polarization level is stored in a database.

For decoding, the present decoder needs to know the permutations employed at the encoder, to apply the inverse permutations before decoding the individual polarization blocks and generating likelihood ratios, and applying appropriate permutations to pass the hard-decisions and likelihood ratios to their corresponding blocks at next polarization level. The present decoder may be used at each polarization level.

Since an exhaustive search is not performed for all permutations when limiting a search to K bit-channels around a boundary, a polarization step may lead to bit-channels crossing the boundary and eventually hurting the maximal polarization criterion. For such a case, the polarization step for those bit-channels hurting the maximal polarization criterion, as good-channel sum capacity or error rate, can be skipped as in relaxed polarization.

Also, suppose the design criterion is to maintain a certain code error probability E. Let the design code rate is R. Then the error probability of the code can be found by union bound as a sum of individual bit-channel error probability E(W) in the good channel set of size R×N, i.e., $E=\Sigma_{W \in G_n} E(W)$. From relaxed polar codes as described earlier, if the individual bit-channel error probabilities are already very good after a certain number of polarizations, the remaining polarization levels for this bit-channel can be skipped. In other words, let $T_G=E_{target}/(R \times N)$, then if $E(W_i^i) \leq T_G$ of a certain bit channel, it is not further polarized. Similarly, very bad channels whose error probability $E(W_i^i) \geq T_B$ for a bad polarization threshold $T_B$ are not further polarized since they have no chance on becoming good channels. As described above, very good bit-channels are polarized together, and similarly, very bad channels are polarized together, while guaranteeing maximal polarization. It is noted that the maximal polarization construction may be combined with the relaxed polar code for the very good channels and very bad channels as well (such that channels within the good channels or bit-channels within the bad channels whose error probability exceeds required error thresholds are not further polarized, and their polarization operation can be skipped while guaranteeing maximal polarization.

If a polarization is skipped (relaxed), a relaxation map needs to indicate which such polarization are skipped while encoding for each polarization level n, so that the decoder will not do the conventional (e.g., normal) decoding operations for these nodes. This is done together with appropriate permutations to take care of maximal polarization.

To further reduce design complexity, one approach is to divide the polarization levels into two stages. In the first stage, default permutations can be used to guarantee polarization of the bit-channels such that a sufficient number of channels are good enough to fall in the good channel set, and a sufficient number of channels are bad enough to fall in the frozen set.

In the second stage, the permutations resulting in maximal polarization are found for each polarization level as described above.

The partitioning of stage is a design parameter according to the target code design complexity, target encoding and decoding computational and storage complexities. This effectively reduces the number of permutations that need to be stored and processed while encoding and decoding but can have an effect on the maximal polarization.

Figure 3:
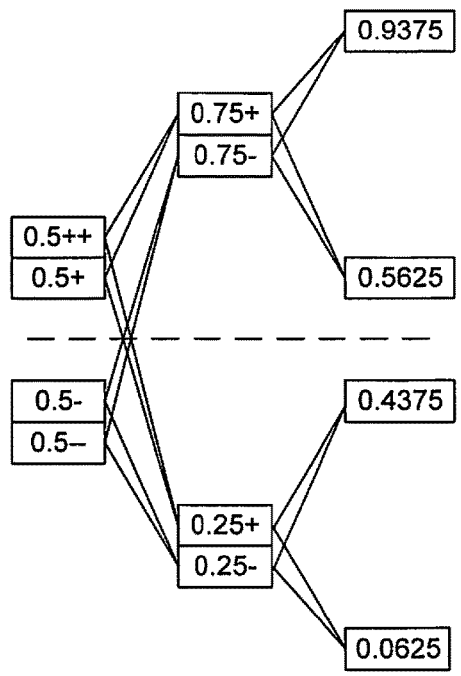
FIG. 3 illustrates an example of maximal code polarization, according to one embodiment.
Figure 4:
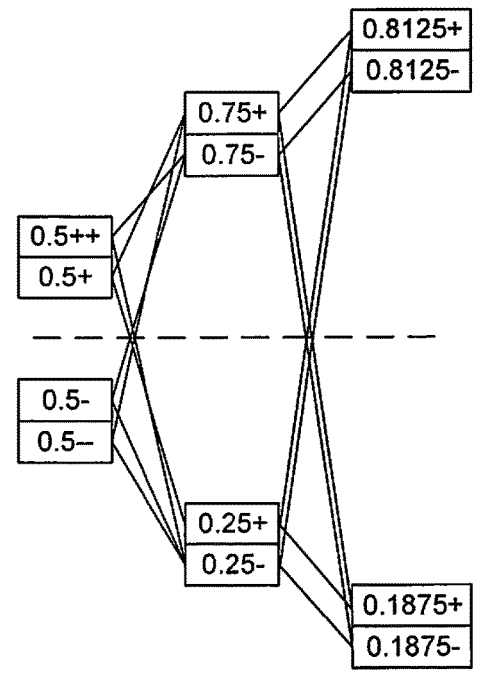
FIG. 4 illustrates an example of maximal code polarization, according to one embodiment.
Figure 5:
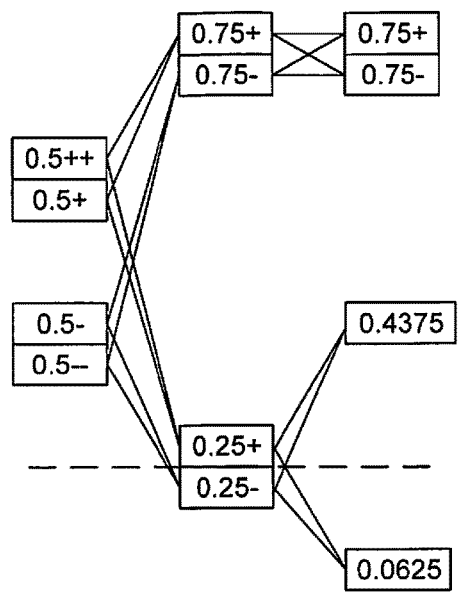
FIG. 5 illustrates an example of maximal code polarization, according to one embodiment.

FIGS. 3, 4, and 5 illustrate examples of maximal code polarization, according to one embodiment.

Referring to FIGS. 3, 4, and 5, standard (normal) polarization is compared to maximal polarization, according to one embodiment. FIG. 3 illustrates normal polarization. The example illustrates four channels, where the error probability of each original channel is 0.5. The example also illustrates a target code rate of 0.5. After two steps of polarization, the sum of information is 1.5 bits, or 0.75 bits/channel.

In the example of FIG. 4, a first level of polarization is identical to normal polarization. However, the second level of polarization chooses one channel from above the threshold and one from below the threshold. The sum of information of two good channels is now increased to 1.625 bits, or 0.8125 bits/channel, which is superior to that achieved in normal polarization illustrated in FIG. 3.

When a target rate goes above 0.625 (3 good channels and 1 bad channel), a normal permutation (FIG. 3) or an alternative permutation (FIG. 5) may be selected. Although the sum of information remains the same, the example illustrated in FIG. 5 may be preferred because there are fewer encoding (and decoding) operations required. The splitting of the multiplicity 2 channels at I=0.25 may also be considered as an example of maximum polarization, because these two channels straddle the rate threshold and therefore are in the "mediocre" set of channels.

The channels are categorized into three groups according to their channel reliability and channels within each group are polarized together. This may be further modified to any number of groups, where similar channels are grouped and polarized together at each polarization stage, and where the grouping is defined by a permutation defined for this stage.

According to one embodiment, a long polar code of length $N=2^n=2^{p+t}$ is constructed based on encoding scheme $B_{2^{p+t}}$ $(F_2^{\otimes p} \times F_2^{\otimes t})$, where the first encoding stages constructs $2^p$ codes, each of length $2^t$ and the second encoding stage polarizes the $2^p$ codes together.

The encoding at the second stage is performed by polarizing the $2^t$ bit-channels with the same index at all $2^p$ codes together, for all such $2^t$ channels. The main idea for compound polar is transmission over multi-channels with different reliabilities, and polarizing similar channels together. The above example, at polarization stage $2^t$ considers a $2^t$ multi-channel, where channels with the same index in the $2^p$ codes have similar reliability, assuming channel variation is of $O(2^t)$.

For maximal polarization, permutation is defined for each sub-code of length $2^t$ to sort channels by their reliabilities, effectively grouping the channels in $2^t$ groups each of size $2^p$ and let channels within each group polarize together as described above. A new permutation is calculated for each polarization stage to guarantee maximal polarization as in above.

Component sub-codes polarizing similar channels may be decoded in parallel, successive cancellation decoding follows between sub-codes of different channels.

Since both the Bhattacharya parameters and the channel capacities approach 0 or 1 at full polarization, a criterion to measure code polarization may be the average $Z(W)(1-Z(W))$, alternatively average $I(W)(1-I(W))$, over all bit-channels. This value approaches 0 for maximally polarized codes, and hence may be used as a measure of polarization without being constrained to a target rate or target error probability.

According to one embodiment, two-stage encoding is combined with maximal polarization in that maximal polarization code design (selecting different permutations at each polarization level) is done at the first stage rather than at the second stage. At the second stage, normal permutations for the polarization steps are applied. Alternatively, maximal polarization may be selectively applied to a subset of bits.

Figure 6:
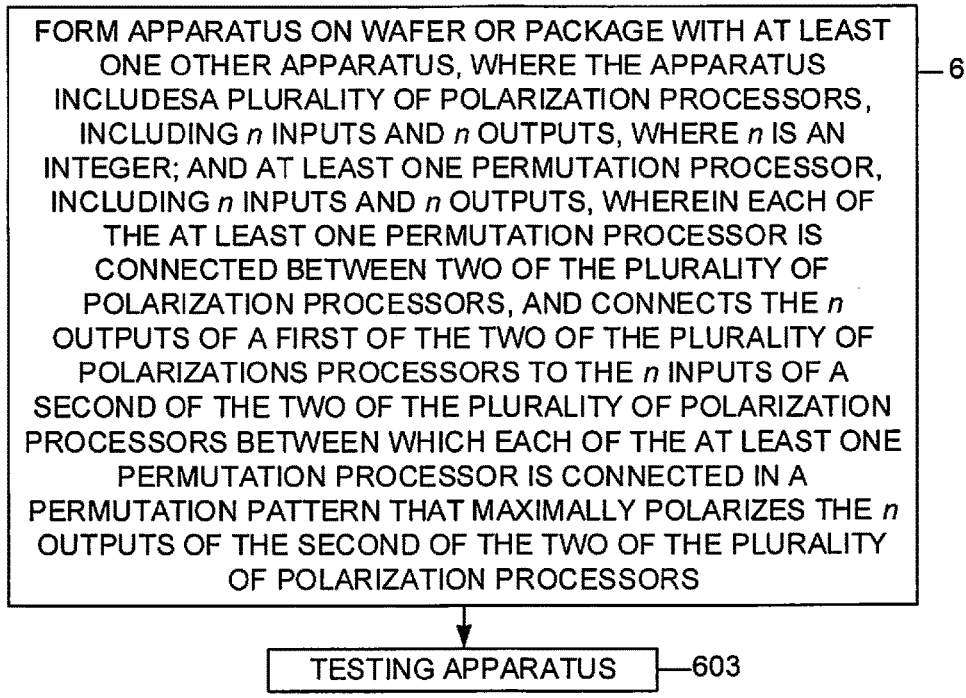
FIG. 6 illustrates an exemplary flowchart of a method of manufacturing a maximal code polarization apparatus, according to one embodiment.

FIG. 6 illustrates an exemplary flowchart of a method of manufacturing a maximal code polarization apparatus, according to one embodiment.

Referring to FIG. 6, an apparatus is formed on a wafer or a package with at least one other apparatus, where the apparatus includes a plurality of polarization processors, including n inputs and n outputs, where n is an integer; and a plurality of permutation processors, including n inputs and n outputs, wherein each of the plurality of permutation processors is connected between two of the plurality of polarization processors, and connects the n outputs of a first of the two of the plurality of polarizations processors to the n inputs of a second of the two of the plurality of polarization processors between which each of the plurality of permutation processors is connected in a permutation pattern that maximally polarizes the n outputs of the second of the two of the plurality of polarization processors, at 601.

At 602, the apparatus is tested. Testing the apparatus may include testing the apparatus using one or more electrical to optical converters, one or more optical splitters that split an optical signal into two or more optical signals, and one or more optical to electrical converters.

Figure 7:
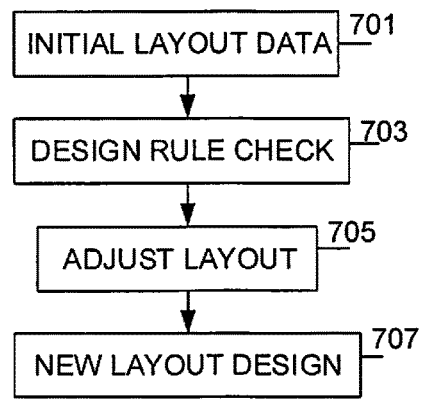
FIG. 7 illustrates an exemplary flowchart of a method of constructing an integrated circuit, according to one embodiment.

FIG. 7 illustrates an exemplary flowchart of a method of constructing an integrated circuit, according to one embodiment.

Referring to FIG. 7, initial layout data is constructed in 701. For example, a mask layout is generated for a set of features for a layer of the integrated circuit, wherein the mask layout includes standard cell library macros for one or more circuit features that include an apparatus that includes a plurality of polarization processors, including n inputs and n outputs, where n is an integer; and a plurality of permutation processors, including n inputs and n outputs, wherein each of the plurality of permutation processors is connected between two of the plurality of polarization processors, and connects the n outputs of a first of the two of the plurality of polarizations processors to the n inputs of a second of the two of the plurality of polarization processors between which each of the plurality of permutation processors is connected in a permutation pattern that maximally polarizes the n outputs of the second of the two of the plurality of polarization processors, and disregarding relative positions of the macros for compliance to layout design rules during the generation of the mask layout.

At 703, a design rule check is performed. For example, the method may check the relative positions of the macros for compliance to layout design rules after generating the mask layout.

At 705, the layout is adjusted. For example, the method, upon detection of noncompliance with the layout design rules by any of the macros, may modify the mask layout by modifying each of the noncompliant macros to comply with the layout design rules.

At 707, new layout data is generated. For example, the method may generate a mask according to the modified mask layout with the set of features for the layer of the integrated circuit. Then, the integrated circuit layer according to the mask may be manufactured.

In one embodiment, the present disclosure may include at least one gate array, at least one field programmable gate array (FPGA), at least one software program, or a combination of at least one standard cell integrated circuit, at least one gate array, at least on FPGA, and/or at least one software program.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
a plurality of polarization processors, including n inputs and n outputs, where n is an integer, wherein the plurality of polarization processors is configured to polarize channels with different bit-channel reliability; and
at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at least one permutation processor is configured to not further polarize a bit channel.

2. The apparatus of claim 1, wherein the plurality of polarization processors are further configured to polarize channels with identical bit-channel reliability.

3. The apparatus of claim 2, wherein the bit-channel reliability is determined by one or more of a Bhattacharya parameter of the bit-channel, information capacity, an expected bit-channel error probability, an expected likelihood ratio, an expected signal-to-noise ratio, and a bit-channel capacity.

4. The apparatus of claim 1, wherein each of the plurality of polarization processors includes an inter-stage permutation at each polarization level to each sub-block of bit channels.

5. The apparatus of claim 4, wherein each inter-stage permutation is identical to or different from each other.

6. The apparatus of claim 1, wherein each of the plurality of polarization processors is further configured to not polarize a bit-channel if the bit-channel's polarization exceeds a first threshold or falls below a second threshold.

7. The apparatus of claim 6, wherein each of the plurality of polarization processors is further configured to not polarize a bit-channel if an aggregated channel polarization is not improved, wherein the aggregated channel polarization is determined based on the first threshold and the second threshold, which are defined by an aggregated bit-channel error probability for a target rate.

8. The apparatus of claim 1, wherein each of the at least one permutation processor is further configured to determine the permutation pattern that permutes at least one of the n outputs that correspond to bit-channels whose information bit-channel capacities are within a predetermined range of a threshold.

9. The apparatus of claim 8, wherein each of the at least one permutation processor is further configured to determine the permutation pattern that permutes at least one of the n outputs of the first of the two of the plurality of polarization processors by swapping connections involving outputs with bit-channel capacities above the threshold and outputs with bit-channel capacities below the threshold.

10. A method, comprising:
polarizing, by a plurality of polarization processors including n inputs and n outputs, where n is an integer, channels with different bit-channel reliability; and
permuting, by at least one permutation processor, n outputs of each of the plurality of polarization processors to not further polarize a bit channel, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern.

11. The method of claim 10, wherein polarizing, by the plurality of polarization processors, is comprised of polarizing channels with one of identical bit-channel reliability and different bit-channel reliability.

12. The method of claim 11, wherein the bit-channel reliability is determined by one or more of a Bhattacharya parameter of the bit-channel, information capacity, an expected bit-channel error probability, an expected likelihood ratio, an expected signal-to-noise ratio, and a bit-channel capacity.

13. The method of claim 10, further comprising permuting an inter-stage of each of the plurality of polarization processors at each polarization level to each sub-block of bit channels.

14. The method of claim 13, wherein each inter-stage permutation is identical to or different from each other.

15. The method of claim 10, further comprising not polarizing, by each of the plurality of polarization processors, a bit-channel if the bit-channel's polarization exceeds a first threshold or falls below a second threshold.

16. The method of claim 15, further comprising not polarizing, by each of the plurality of polarization processors, a bit-channel if an aggregated channel polarization is not improved, wherein the aggregated channel polarization is determined based on the first threshold and the second threshold, which are defined by an aggregated bit-channel error probability for a target rate.

17. The method of claim 10, further comprising determining, by each of the at least one permutation processor, the permutation pattern that permutes at least one of the n outputs that correspond to bit-channels whose information bit-channel capacities are within a predetermined range of a threshold.

18. The method of claim 17, further comprising determining, by each of the at least one permutation processor, the permutation pattern that permutes at least one of the n outputs of the first of the two of the plurality of polarization processors by swapping connections involving outputs with bit-channel capacities above the threshold and outputs with bit-channel capacities below the threshold.

19. A method of manufacturing an apparatus, comprising:
forming the apparatus on a wafer or a package with at least one other apparatus, wherein the apparatus comprises a plurality of polarization processors, including n inputs and n outputs, where n is an integer, wherein the plurality of polarization processors is configured to polarize channels with different bit-channel reliability, and at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at least one permutation processor is configured to not further polarize a bit channel; and
testing the apparatus, wherein testing the coarse timing and frequency synchronization apparatus comprises testing the apparatus using one or more electrical to optical converters, one or more optical splitters that split an optical signal into two or more optical signals, and one or more optical to electrical converters.

20. A method of constructing an integrated circuit, comprising:
generating a mask layout for a set of features for a layer of the integrated circuit, wherein the mask layout includes standard cell library macros for one or more circuit features that include an apparatus comprising a plurality of polarization processors, including n inputs and n outputs, where n is an integer, wherein the plurality of polarization processors is configured to polarize channels with different bit-channel reliability, and at least one permutation processor, including n inputs and n outputs, wherein each of the at least one permutation processor is connected between two of the plurality of polarization processors, and connects the n outputs of a first of the two of the plurality of polarizations processors to the n inputs of a second of the two of the plurality of polarization processors between which each of the at least one permutation processor is connected in a permutation pattern, wherein at least one permutation processor is configured to not further polarize a bit channel;
disregarding relative positions of the macros for compliance to layout design rules during the generation of the mask layout;
checking the relative positions of the macros for compliance to layout design rules after generating the mask layout;
upon detection of noncompliance with the layout design rules by any of the macros, modifying the mask layout by modifying each of the noncompliant macros to comply with the layout design rules;
generating a mask according to the modified mask layout with the set of features for the layer of the integrated circuit; and
manufacturing the integrated circuit layer according to the mask.

* * * * *